(12) United States Patent
Bottiglio et al.

(10) Patent No.: US 10,688,714 B2
(45) Date of Patent: Jun. 23, 2020

(54) METHODS AND SYSTEMS FOR FABRICATING ELASTOMER-BASED ELECTRONIC DEVICES AND DEVICES FORMED THEREBY

(71) Applicant: Purdue Research Foundation, West Lafayette, IN (US)

(72) Inventors: Rebecca Kramer Bottiglio, New Haven, CT (US); Michelle Ching-Sum Yuen, New Haven, CT (US)

(73) Assignee: Purdue Research Foundation, West Lafayette, IN (US)

( * ) Notice: Subject to any disclaimer, the term of this patent is extended or adjusted under 35 U.S.C. 154(b) by 72 days.

(21) Appl. No.: 15/662,762

(22) Filed: Jul. 28, 2017

(65) Prior Publication Data

US 2018/0029290 A1   Feb. 1, 2018

Related U.S. Application Data

(60) Provisional application No. 62/367,700, filed on Jul. 28, 2016.

(51) Int. Cl.
*B29C 64/106* (2017.01)
*B33Y 30/00* (2015.01)
(Continued)

(52) U.S. Cl.
CPC .......... *B29C 64/106* (2017.08); *B29C 64/209* (2017.08); *B33Y 30/00* (2014.12);
(Continued)

(58) Field of Classification Search
CPC ..... B29C 64/106; B29C 64/209; B33Y 30/00; B33Y 70/00; B33Y 80/00; G01B 7/18;
(Continued)

(56) References Cited

U.S. PATENT DOCUMENTS 8,191,433 B2    6/2012  Tao et al.
8,281,414 B2 *  10/2012 Mickle ............... A41D 13/0518
                                            2/115
(Continued)

FOREIGN PATENT DOCUMENTS

WO    20140109799    7/2014

*Primary Examiner* — Octavia Hollington
(74) *Attorney, Agent, or Firm* — Hartman Global IP Law; Gary M. Hartman; Domenica N. S. Hartman

(57) ABSTRACT

Methods and systems suitable for fabricating multi-layer elastic electronic devices, and elastic electronic devices formed thereby. A method of fabricating an elastomer-based electronic device includes printing a first liquid material and then a second liquid material on a fabric substrate that comprises fibers. The first and second liquid materials are sequentially printed with a three-dimensional printer that directly prints the first liquid material onto the fabric substrate so that the first liquid material wicks through some of the fibers of the fabric substrate and forms a solid matrix of an elastomer-based composite that comprises the matrix and the fabric substrate, after which the three-dimensional printer directly prints the second liquid material on the elastomer-based composite to form a film thereon. The elastomer-based composite and film are electrical components of the elastomer-based electronic device.

16 Claims, 3 Drawing Sheets

(51) Int. Cl.
    *B33Y 80/00*    (2015.01)
    *B33Y 70/00*    (2020.01)
    *G01B 7/16*     (2006.01)
    *H05K 3/00*     (2006.01)
    *H05K 3/12*     (2006.01)
    *H05K 1/16*     (2006.01)
    *H05K 1/03*     (2006.01)
    *B29C 64/209*   (2017.01)
    *H05K 1/09*     (2006.01)
    *B29L 31/00*    (2006.01)
    *B29K 21/00*    (2006.01)

(52) U.S. Cl.
    CPC .............. *B33Y 70/00* (2014.12); *B33Y 80/00* (2014.12); *G01B 7/18* (2013.01); *G01B 7/22* (2013.01); *H05K 1/038* (2013.01); *H05K 1/16* (2013.01); *H05K 1/162* (2013.01); *H05K 1/167* (2013.01); *H05K 3/0011* (2013.01); *H05K 3/1241* (2013.01); *H05K 3/1283* (2013.01); *B29K 2021/00* (2013.01); *B29K 2913/00* (2013.01); *B29K 2995/0006* (2013.01); *B29L 2031/752* (2013.01); *H05K 1/095* (2013.01); *H05K 2201/10151* (2013.01)

(58) Field of Classification Search
    CPC . G01B 7/22; H05K 1/038; H05K 1/16; H05K 1/162; H05K 1/167; H05K 3/0011; H05K 3/1241; H05K 3/1283; H05K 1/095; H05K 2201/10151; B29L 2031/752; B29K 2021/00; B29K 2913/00; B29K 2995/0006
    USPC .................................................. 73/774, 777
    See application file for complete search history.

(56) References Cited

U.S. PATENT DOCUMENTS

| | | | |
|---|---|---|---|
| 8,287,510 B2* | 10/2012 | MacDonald | A61F 13/5514 106/31.13 |
| 8,414,962 B2* | 4/2013 | McKinstry | H01G 4/1227 101/327 |
| 9,005,710 B2* | 4/2015 | Jones | A43B 13/14 427/288 |
| 2013/0312541 A1 | 11/2013 | Majidi et al. | |
| 2014/0040340 A1 | 2/2014 | Shimizu | |
| 2014/0107603 A1* | 4/2014 | Maldonado | A61F 13/51496 604/365 |
| 2014/0238153 A1 | 8/2014 | Wood et al. | |
| 2015/0040282 A1* | 2/2015 | Longinotti-Buitoni | A61B 5/6804 2/69 |

* cited by examiner

METHODS AND SYSTEMS FOR FABRICATING ELASTOMER-BASED ELECTRONIC DEVICES AND DEVICES FORMED THEREBY

CROSS REFERENCE TO RELATED APPLICATIONS

This application claims the benefit of U.S. Provisional Application No. 62/367,700, filed Jul. 28, 2016, the contents of which are incorporated herein by reference.

STATEMENT REGARDING FEDERALLY SPONSORED RESEARCH

This invention was made with government support under NNX14A052G awarded by National Aeronautics and Space Administration and under DGE-1333468 awarded by the National Science Foundation. The government has certain rights in the invention.

BACKGROUND OF THE INVENTION

The present invention generally relates to methods and systems for fabricating elastomer-based electronic devices. The invention particularly relates to methods and systems for fabricating elastomer-based electronic devices, as a nonlimiting example, an elastomer-based strain sensor of a wearable sensory garment.

Liquid-conductor embedded elastic sensors generally comprise liquid-conductor traces embedded within an elastomer material. As nonlimiting examples, such sensors have found use as elastic strain sensors for artificial skins and wearable exosuits, wearable tactile keypads, and non-differential elastomer curvature sensors. Various processes can be used to fabricate liquid-conductor embedded elastomer sensors, for example, by injecting a liquid conductor into a cavity between individually-cast elastomer components that have been bonded together, or by encapsulating a liquid conductor that has been direct-written on an elastomer substrate, or embedded 3D printing by extruding conductive fluid inside of uncured elastomer material. The sensors may then be integrated onto a substrate, for example, the fabric of an exosuit, artificial skin, or other wearable sensory garment, using straps, hook-and-loop fasteners, and adhesives, as nonlimiting examples.

Other types of elastic sensors utilize electrically-conductive elastomer films as one or more of their electrical components. One of the challenges of using conductive elastomer films in highly deformable sensors is the tendency for their material properties, including electrical conductivity (resistance) and Young's modulus, to change over time. Consequently, conductive elastomer films tend to be more suitable for use in roles other than the sensing element, for example, when used as the electrodes of a capacitive sensor. Many examples of capacitive sensors appear in the soft electronics literature, including those for sensing strain, pressure, and proximity. Such sensors have been reported as fabricated from a variety of materials, including metal electrodes, carbon nanotubes, liquid metals, printed conductive inks, conductive elastomers, graphene-filled sponges, conductive fibers, silver nanowires, and salt solutions. Although these examples utilize different fabrication methods and materials, the diversity of approaches illustrates the underlying utility of capacitive sensing in many applications.

Complications encountered when incorporating elastic sensors into wearable sensory garments include the flexibility of the sensor's electrical components, the preparation of the garment fabric, and adhesion of the sensor to the garment fabric. The manufacture process is often separated into multiple steps, such as those noted above, creating need for oversight and additional costs. As such, there is an ongoing need for less complicated methods suitable for manufacturing elastic sensors, including but not limited to elastomer-based sensors incorporated into wearable sensory garments.

BRIEF DESCRIPTION OF THE INVENTION

The present invention provides methods and systems suitable for fabricating multilayer elastomer-based electronic devices, and elastomer-based electronic devices formed thereby.

According to one aspect of the invention, a method of fabricating an elastomer-based electronic device includes printing a first liquid material and then a second liquid material on a fabric substrate that comprises fibers. The first and second liquid materials are sequentially printed with a three-dimensional printer that directly prints the first liquid material onto the fabric substrate so that the first liquid material wicks through some of the fibers of the fabric substrate and forms a solid matrix of an elastomer-based composite that comprises the matrix and the fabric substrate, after which the three-dimensional printer directly prints the second liquid material on the elastomer-based composite to form a film thereon. The elastomer-based composite and film are electrical components of the elastomer-based electronic device.

According to another aspect of the invention, an elastomer-based electronic device includes a fabric substrate and first and second elastomer-based electrical components of the elastomer-based electronic device. The first elastomer-based electrical component comprises an elastomer-based composite that comprises the fabric substrate and an elastomer-based matrix formed of a first cured elastomer material, and the second elastomer-based electrical component comprises an elastomer-based film formed of a second cured elastomer material. One of the first and second elastomer-based electrical components is an electrically-conductive component of the elastomer-based electronic device, and the other of the first and second electrical components is a dielectric component of the elastomer-based electronic device.

Another aspect of the invention is a three-dimensional printer system for fabricating an elastomer-based electronic device. The system includes different liquid materials in multiple syringes, and a delivery system comprising a nozzle, tubing for individually connecting one of the syringes to the nozzle, and means for actuating the syringes to selectively dispense one of the liquid materials through the nozzle.

Technical aspects of the methods, devices, and systems described above preferably include the ability to incorporate elastomer-based electronic devices directly into the fabric of a wearable sensory garment.

Other aspects and advantages of this invention will be further appreciated from the following detailed description.

DETAILED DESCRIPTION OF THE INVENTION

Figure 1:
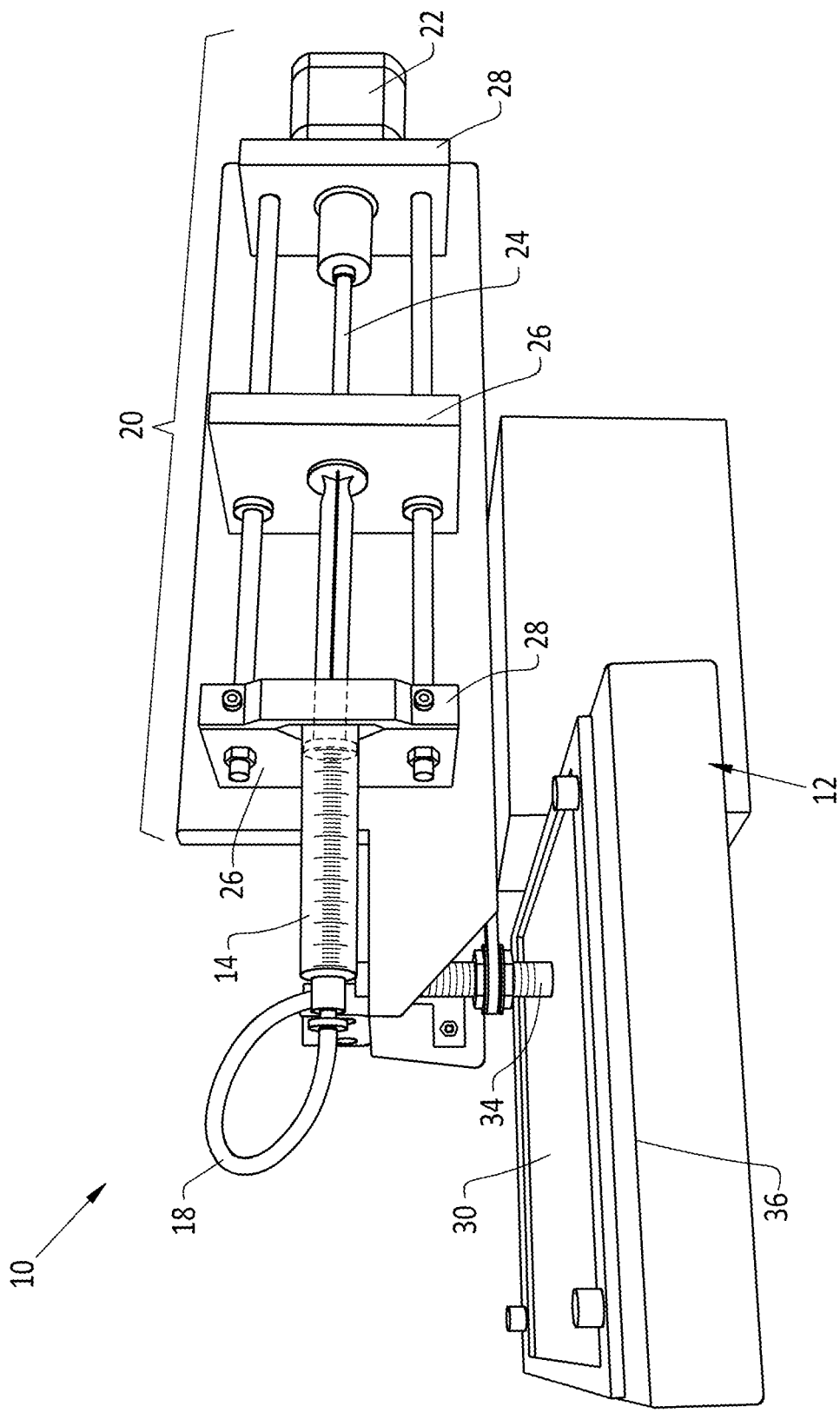
FIGS. 1 and 2 show different views of an embodiment of a three-dimensional (3D) printing system suitable for incorporating a multilayer elastomer-based electronic device directly into a fabric substrate.

The following describes methods and systems suitable for fabricating elastic electronic devices, and particularly for incorporating at least one multilayer elastic sensor into a fabric substrate such that at least a portion of the sensor is embedded within fibers of the fabric, as opposed to attaching such a device to the surface of a fabric substrate. The fabric substrate may be part of a wearable sensory garment, which as used herein refers to a garment adapted to be worn by a living being and equipped with sensors adapted to monitor the motion and/or other physiological parameters of an individual wearing the garment. Such a garment may include multiple sensors, which in combination may be referred to as a fabric-based sensory array.

Fabrication methods are described below as utilizing a single-process manufacturing technique, similar to three-dimensional (3D) printing, which enables a rapid manufacturing approach that has the potential for reducing manufacturing costs. Through the use of elastomer materials and, in some embodiments, liquid conductors, high functionality and high performance of wearable sensory garments may be achieved. Such garments may also exhibit enhanced durability and sensitivity to forces and motions acting on the fabric substrate into which the sensors are incorporated, paving the way for the possibility of smarter, programmable wearable sensory garments.

Sensors described herein comprise elastomer-based electrical components formed of elastomer materials. One of the components is formed in such a way as to be at least partially embedded within the fibers of a fabric substrate to yield what will be referred to herein as an elastomer-based composite, resulting from the elastomer material forming a solid matrix for the portion of the fabric substrate infiltrated by the elastomer material. At least one additional elastomer-based electrical component is formed as an elastomer-based film that overlies the elastomer-based composite so as not to be embedded within the fibers of the fabric substrate. The elastomer-based composite, reinforced by fibers of the fabric, structurally attaches the sensor and its other components to the fabric substrate.

The elastomer-based composite and elastomer-based film (s) of a given sensor may be dielectric or electrically conductive, depending on the type of sensor being fabricated. In one embodiment, the sensor comprises a capacitor whose elastomer-based composite is electrically conductive and serves as one of two electrodes of the capacitor. The second electrode of the capacitor is an elastomer-based film (as described above) that is also electrically conductive. The electrodes formed by the electrically-conductive elastomer-based composite and film are separated by another elastomer-based film (as described above) formed of a dielectric material to function as the insulator of the capacitor. The insulator formed by the dielectric elastomer-based film is able to deform when the sensor experiences strain in response to an applied force, pressure, etc., thus changing the electrical capacitance of the capacitor as measured across the two electrodes.

In other embodiments, the sensor comprises a resistor whose elastomer-based composite is dielectric. The resistor comprises an elastomer-based film (as described above) that is also dielectric, and the dielectric elastomer-based composite and film serve as dielectric components of the resistor that are separated by a resistive component of the resistor. In combination, the dielectric elastomer-based composite and dielectric elastomer-based film may encapsulate the resistive component, which may be an electrically-conductive elastomer-based film (as described above) formed of an electrically-conductive elastomer material or an electrically-conductive liquid film formed by a liquid conductor. In either case, the resistive component is able to deform when the sensor experiences strain in response to an applied force, pressure, etc., thus changing the electrical resistance of the resistor.

Suitable elastomer materials for the elastomer-based composite and elastomer-based film(s) include highly flexible polymers whose precursors are liquid materials. As known, the precursors can be prepared by mixing two liquid components that include the base (chains of the elastomer) and crosslinking agents to form a liquid pre-polymer mixture, and then degassing the mixture. Nonlimiting examples include rubbers, such as silicone elastomers whose precursors are high viscosity liquids (for example, about 105 cps). The viscosity of precursors and other liquid materials used to form components of electrical devices may be modified with a solvent, toluene as a nonlimiting example, to reduce the pressure required to extrude the material. Silicone and other elastomer materials may have suitable dielectric properties for purposes of, as described above, forming a dielectric elastomer-based film (for example, to fabricate the insulator of a capacitor or the outer layer of a resistor) or forming a dielectric elastomer-based composite (for example, to fabricate an inner layer of a resistor), in which case such materials can be considered to be dielectric elastomer materials for purposes of the present invention. It is foreseeable that dielectric additives and/or fillers could be admixed with the liquid pre-polymer of silicone (or another elastomer material) to increase the dielectricity of the cured elastomer material.

For purposes of, as described above, forming an electrically-conductive elastomer-based film (for example, to fabricate an electrode of a capacitor or the resistive layer of a resistor) or forming an electrically-conductive elastomer-based composite (for example, to fabricate an electrode of a capacitor), it is foreseeable that electrically-conductive additives and/or fillers could be admixed with the liquid pre-polymer of silicone (or another elastomer material) to increase its electrical conductivity and, after curing, yield what can be considered to be an electrically-conductive elastomer material for purposes of the present invention. A nonlimiting example of a known and particularly suitable additive is particles of expanded intercalated graphite (EIG).

As described above, for purposes of forming an electrically-conductive liquid film suitable for use as the resistive layer of a resistor, a liquid electrical conductor may be used, for example, a liquid metal or an ionic liquid, instead of an electrically-conductive elastomer-based film. Nonlimiting examples of suitable liquid metals include mercury, gallium-indium alloys, and gallium-indium-tin alloys. Nonlimiting examples of suitable ionic liquids include salt solutions (as nonlimiting examples, saline solutions, solutions of sodium chloride, water, and glycerol, and other salt solutions), 1-ethyl-3-methylimidazolium dicyanamide, 1-butyl-3,5-dimethylpyridinium bromide, and 1-Ethyl-3-methylimidazolium chloride.

Figure 2:
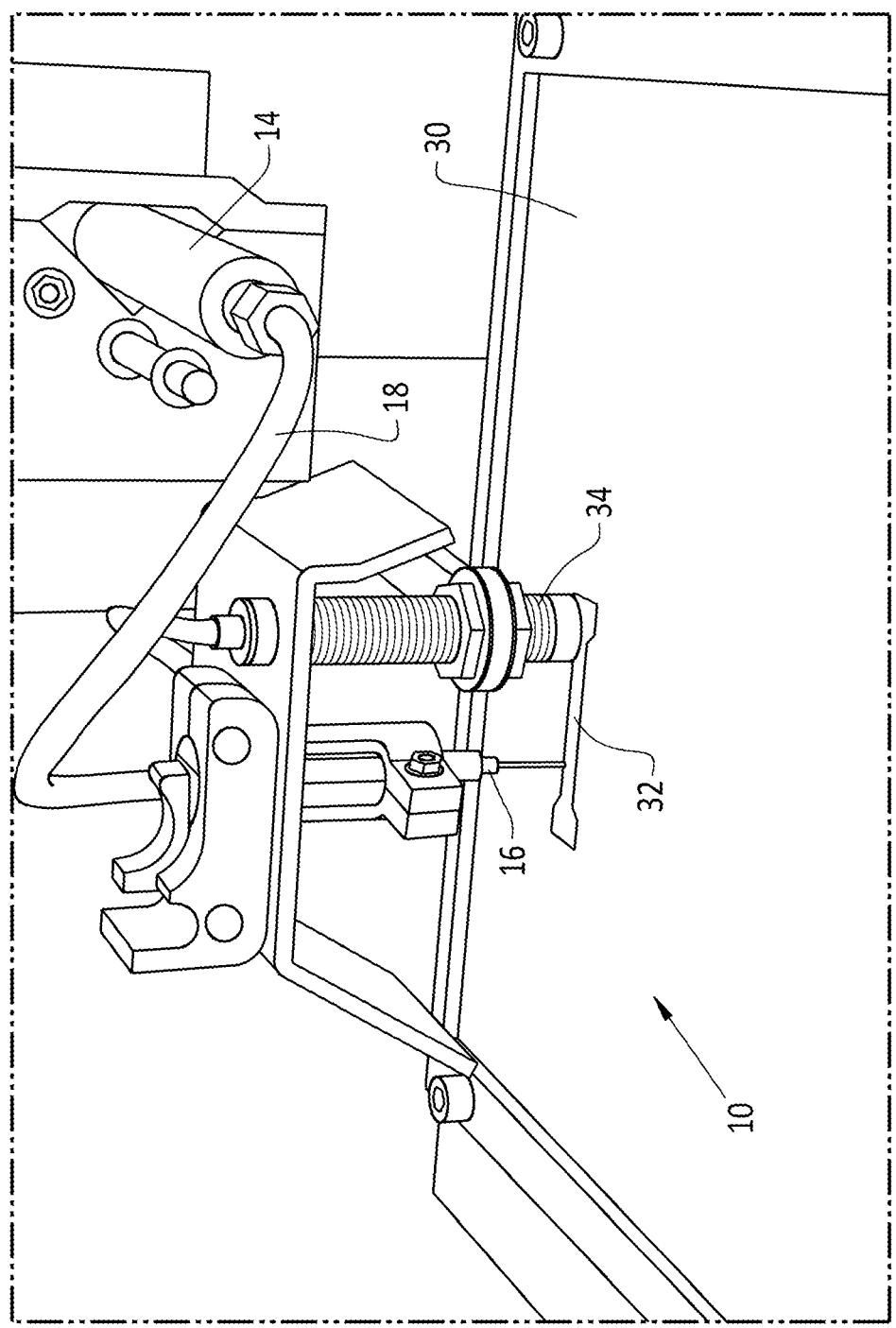

In view of the foregoing, it should be understood that the term "liquid" is employed to describe a flowable material, and therefore encompasses liquids and mixtures of solids and liquids. Liquid precursors of suitable elastomer materials are capable of being printed by a printing system, for example, a modified fused-deposition-modeling (FDM) three-dimensional (3D) printing system 10 represented in FIGS. 1 and 2. The 3D printing system 10 is referred to as modified due to being adapted to print and incorporate liquid materials directly into fabric substrates. For this purpose, the printing system 10 is shown in FIGS. 1 and 2 as comprising a liquid delivery system 12 that replaces a plastic filament feed conventionally utilized with 3D printing systems. The delivery system 12 includes a syringe 14, a nozzle 16, tubing 18 for individually connecting the syringe 14 to the nozzle 16, and an actuation assembly 20 as means for actuating the syringe 14 to selectively dispense a liquid material from the syringe 14, through the nozzle 16, and onto a fabric substrate 30 beneath the nozzle 16. In the nonlimiting embodiment represented in FIGS. 1 and 2, the actuation assembly 20 comprises a motor 22 that drives a ball screw 24, and a ball nut 26 that travels along the axis of the ball screw 24. The syringe 14 and motor 22 are mounted to the printer system 10 with plates 28, between which the ball nut 26 travels to move the plunger of the syringe 14 when the ball screw 24 is rotated by the motor 22. Control of the motor 22, and thus the extrusion of a liquid material from the syringe 14, may be accomplished through a control board with which 3D printers are conventionally equipped.

During printing, a liquid material (for example, a liquid conductor or a precursor of an elastomer material) within the syringe 14 is extruded onto the fabric substrate 30 through the nozzle 16. The 3D printing system 10 provides relative motion in three dimensions between the nozzle 16 and the fabric substrate 30. The printing system 10 fabricates a multilayer elastic sensor layer-by-layer from the substrate 30 outwards (upwards). FIGS. 1 and 2 depict a probe 34 for sensing the distance to the surface of the substrate 30. The nozzle 16 and probe 34 are caused to travel together along an axis (for example, the z-axis) perpendicular to the plane of the substrate 30, and along one axis (for example, the y-axis) in the plane of the substrate 30. The substrate 30 is supported on a stage 36, which is caused to travel along an axis (for example, the x-axis) in the plane of the substrate 30 but orthogonal to the y-axis. G-code may be used to control the movements of the nozzle 16, stage 36, and delivery system 20, which in turn controls the patterning and deposition of the liquid materials. As known in the art, G-code is a numerical control programming language often used in computer numerically controlled (CNC) machines and 3D printers. G-code commands are capable of describing the tool path of the nozzle 16 to a specific position at a certain speed, material deposition rate, and other printer settings. Slic3r software may be used to generate G-code commands from an .stl model of the multilayer elastomer-based device being fabricated.

FIG. 2 shows a liquid precursor 32 of an elastomer material that has been directly printed onto the fabric substrate 30, such that the liquid precursor 32 has wicked into and infiltrated the underlying surface region of the substrate 30 and, once cured, will form an elastomer-based composite as described above. Infiltration of the substrate 30 is such that the cured elastomer-based composite cannot be removed from the fabric substrate 30 without tearing the composite or substrate 30. Suitable dimensions for the nozzle 16 will depend on the desired feature sizes of the components being printed and the particular application for the electronic device being fabricated. A nonlimiting range for the diameter of the nozzle is believed to be about 0.1 to about 10 mm, though a nozzle diameter of about 1 millimeter or less is believed to be preferred to promote the resolution of the printed elastomer-based composite, with a preferred range being 0.5 to 1.0 mm.

It should be appreciated that the capabilities of the 3D printing system 10 represented in FIGS. 1 and 2 may be extended beyond the embodiments discussed above. Fundamentally, the system 10 may be capable of printing any liquid onto any flat substrate, in which case various materials could be substituted for the fabric substrate 30 and the liquid materials (for example, liquid conductors or elastomer precursors). The system 10 can be extended with additional syringes (for example, essentially identical to the syringe 14 shown in FIGS. 1 and 2), each dedicated to deposit a different liquid electrical conductor or liquid elastomer precursor, enabling production of multi-material, multilayer elastic sensors and other multi-material, multilayer elastomer-based electronic devices in a single manufacturing step. Furthermore, multiple patterns of dielectric and electrically-conductive elastomer-based films and electrically-conductive liquid films can be printed to form any number of conductors and insulators for the purpose of fabricating a wide variety of circuits and devices.

Figure 3:
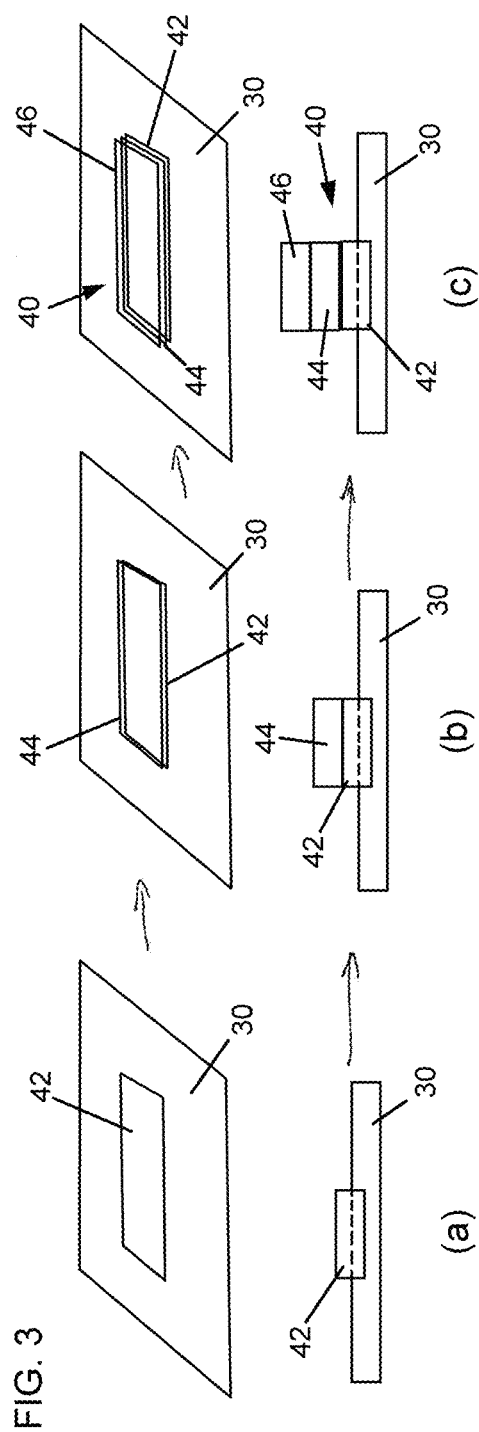
FIGS. 3 and 4 represent nonlimiting steps, labeled as (a), (b), and (c), which are carried out for incorporating multilayer elastomer-based electronic devices directly into a fabric substrate according to two different nonlimiting embodiments of the invention.
Figure 4:
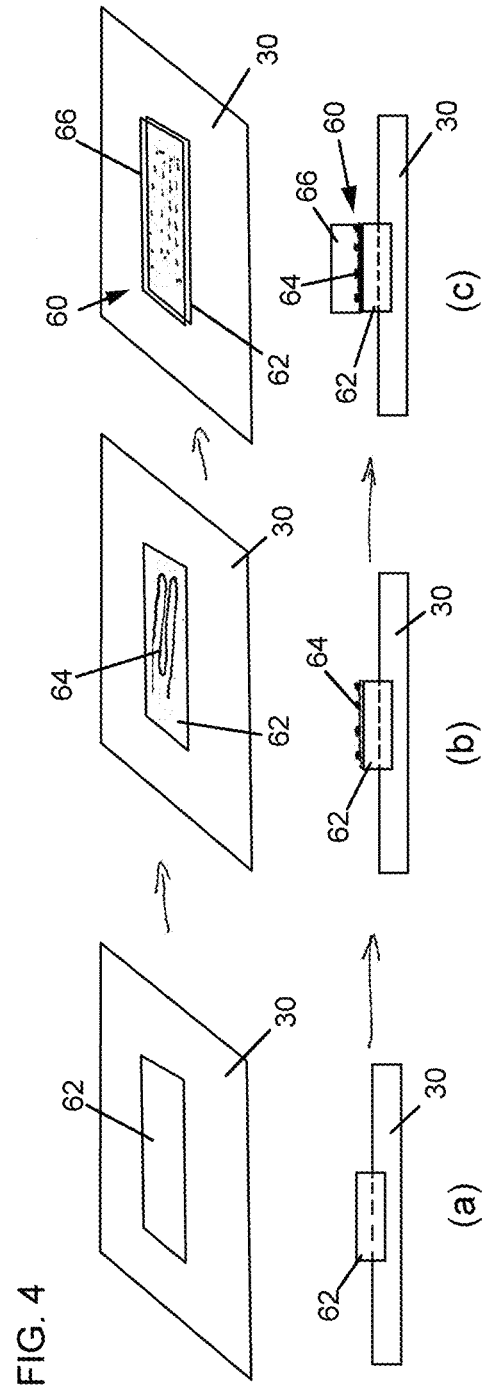

FIGS. 3 and 4 schematically represent processing steps that may occur during the fabrication of, respectively, a multilayer elastomer-based capacitor 40 and a multilayer elastomer-based resistor 60 when employing processes, materials, and the printing system 10 discussed above. Both of these multilayer elastomer-based devices can be fabricated as an elastic strain sensor incorporated into a wearable sensory garment, in which case the fabric substrate 30 depicted in FIGS. 3 and 4 forms a portion of the garment. The illustrated steps are labeled in FIGS. 3 and 4 as steps (a), (b), and (c), with each step being represented by two images, the upper of which is an isometric view and the lower of which is a cross-sectional view.

In step (a) of FIG. 3, a quantity of a first liquid material that comprises a precursor of an electrically-conductive elastomer material has been directly printed on the fabric substrate 30 so that a portion of the liquid material has infiltrated a surface region of the fabric substrate 30 as a result of having wicked through fibers of the fabric substrate 30, after which the precursor is at least partially cured to form a solid matrix of an electrically-conductive elastomer-based composite 42 that comprises the matrix and fibers of the fabric substrate 30. The elastomer-based composite 42 will serve as one of two electrodes of the elastomer-based capacitor 40. In step (b) of FIG. 3, a quantity of a second liquid material that comprises a precursor of a dielectric elastomer material has been directly printed on the electrically-conductive elastomer-based composite 42, after which the precursor of the dielectric elastomer material is at least partially cured to form a dielectric elastomer-based film 44 suitable as an insulator of the elastomer-based capacitor 40. In step (c) of FIG. 3, an additional quantity of the first liquid material has been directly printed on the dielectric elastomer-based film 44, after which the precursor of the electrically-conductive elastomer material is at least partially cured to form an electrically-conductive elastomer-based film 46 that serves as the second of the two electrodes of the elastomer-based capacitor 40. During this process, the first and second liquid materials are printed using two separate syringes that are actuated in sequence to dispense the first liquid material through the nozzle 16 and then dispense the second liquid material through the nozzle 16. The curing steps performed after each printing operation can be achieved in any suitable manner, and will depend on the particular compositions and characteristics of the elastomer materials being cured. During investigations leading to the present invention, the stage 36 of the printing system 10 was heated to promote curing.

In step (a) of FIG. 4, a quantity of a first liquid material that comprises a precursor of a dielectric elastomer material has been directly printed on the fabric substrate 30 so that a portion of the liquid material has infiltrated a surface region of the fabric substrate 30 as a result of having wicked through fibers of the fabric substrate 30, after which the precursor is at least partially cured to form a solid matrix of a dielectric elastomer-based composite 62 that comprises the matrix and fibers of the fabric substrate 30. In step (b) of FIG. 4, a quantity of a second liquid material has been directly printed on the dielectric elastomer-based composite 62. The second liquid material is to form the conductive component (resistive element) 64 of the resistor 60, and is represented as having been printed to define a serpentine-shaped trace. The second liquid material may comprise a liquid conductor or a precursor of an electrically-conductive elastomer material. If the former, the conductive component 64 is in the form of an electrically-conductive liquid film and the process depicted in FIG. 4 may continue directly to step (c), whereas if the latter the precursor must first undergo at least partial curing to form the conductive component 64 as an electrically-conductive elastomer film. In step (c) of FIG. 4, an additional quantity of the first liquid material has been directly printed on the conductive component 64, after which the precursor of the dielectric elastomer material is at least partially cured to form a second dielectric elastomer-based film 66, which with the dielectric elastomer-based composite 62 encapsulates the conductive component 64 to yield the elastomer-based resistor 60. As with the process of FIG. 3, the first and second liquid materials are preferably printed using two separate syringes that are actuated in sequence to dispense the first liquid material, then the second liquid material, and then finally again the first liquid material through the nozzle 16. The curing steps can be achieved in any suitable manner, depending on the particular compositions and characteristics of the elastomer materials being cured.

In each of the embodiments of FIGS. 3 and 4, the electrically-conductive and dielectric elastomer materials serve as solid matrices for their respective electrically-conductive elastomer-based composite 42 and dielectric elastomer-based composite 62, and the elastomer-based composites 42 and 62 and elastomer-based films 44, 46, 64, 66 are sufficiently deformable for use as components of elastic strain sensors of a wearable sensory garment. If the conductive component 64 is instead an electrically-conductive liquid film, the liquid film is inherently sufficiently deformable for use as a component of an elastic strain sensor of a wearable sensory garment, and the dielectric elastomer-based composite 62 and dielectric elastomer-based film 66 serve as highly deformable encapsulating layers for the electrically-conductive liquid film.

As previously noted, a nonlimiting application for the processes, materials, and system described above is a wearable sensory garment equipped with one or more elastic strain sensors. Alternatively, the fabric substrates into which the elastomer-based composites are incorporated may be used to produce a wide variety of deployable, inflatable, and collapsible structures and soft systems, including but not limited to human contact furniture (chairs, wheelchairs, beds, etc.). The fabric substrates into which the elastomer-based composites are incorporated are more durable (higher tensile yield stress) than the elastomer materials that infiltrate the substrates to form the composites, such that a more robust strain sensor is formed that is capable of interacting with the wearer (host body) or user. Elastic strain sensors fabricated as described above are especially well suited for measuring large deformations, for example, exceeding 50% strain. Because fabrication makes use of 3D printing technology, the invention provides for an automated and highly scalable manufacturing approach for producing garments, structures, soft systems, etc., equipped with elastic strain sensors.

While the invention has been described in terms of particular embodiments, it should be apparent that alternatives could be adopted by one skilled in the art. For example, electronic devices and their components could differ in appearance and construction from the embodiments described herein and shown in the drawings, functions of certain components of the system 10 could be performed by components of different construction but capable of a similar (though not necessarily equivalent) function, process parameters could be modified, and appropriate materials could be substituted for those noted. In addition, the invention encompasses additional or alternative embodiments in which one or more features or aspects of a particular embodiment could be eliminated or two or more features or aspects of different disclosed embodiments could be combined. Accordingly, it should be understood that the invention is not necessarily limited to any embodiment described herein or illustrated in the drawings. It should also be understood that the phraseology and terminology employed above are for the purpose of describing the illustrated embodiments, and do not necessarily serve as limitations to the scope of the invention. Therefore, the scope of the invention is to be limited only by the following claims.

The invention claimed is:
1. A method of fabricating an elastomer-based strain-sensing electronic device, the method comprising:
  printing a first quantity of a first liquid material on a fabric substrate that comprises fibers, the first liquid material being printed with a three-dimensional printer, the three-dimensional printer directly printing the first liquid material onto the fabric substrate so that a portion of the first liquid material infiltrates a surface region of the fabric substrate as a result of the first liquid material wicking through some of the fibers of the fabric substrate;
  at least partially curing the first quantity of the first liquid material to form a solid matrix of an elastomer-based composite that comprises the matrix and the fabric substrate, wherein infiltration of the fabric substrate is such that the elastomer-based composite cannot be removed from the fabric substrate without tearing the elastomer-based composite or the fabric substrate;
  printing a second liquid material on the elastomer-based composite with the three-dimensional printer to form a first film on the elastomer-based composite;
  printing an additional quantity of the first liquid material on the film with the three-dimensional printer to form an elastomer-based film on the first film;
  wherein the elastomer-based composite, the first film, and the elastomer-based film are elastically-deformable electrical components of the elastomer-based strain-sensing electronic device and elastically deform when the elastomer-based strain-sensing electronic device experiences strain of at least 50%, and either:

the elastomer-based strain-sensing electronic device is a capacitor, the first film is a dielectric and an insulator of the capacitor, and the elastomer-based composite and the elastomer-based film are electrically conductive and are electrodes of the capacitor; or the elastomer-based strain-sensing electronic device is a resistor, the first film is electrically conductive and a resistive element of the resistor, and the elastomer-based composite and the elastomer-based film are dielectrics and encapsulate the first film.

2. The method according to claim 1, wherein the elastomer-based strain-sensing electronic device is the capacitor, the first film is the insulator of the capacitor, and the elastomer-based composite and the elastomer-based film are the electrodes of the capacitor.

3. The method according to claim 2, wherein the first liquid material comprises a precursor of an electrically-conductive elastomer material and the second liquid material comprises a precursor of a dielectric elastomer material.

4. The method according to claim 3, wherein the precursor of the electrically-conductive elastomer material comprises conductive particles dispersed in a liquid pre-polymer.

5. The method according to claim 3, the method further comprising:
curing the precursor of the dielectric elastomer material after the printing thereof to form the first film.

6. The method according to claim 5, the method further comprising, after the curing of the precursor of the dielectric elastomer material to form the first film:
curing the additional quantity of the precursor of the electrically-conductive elastomer material to form the elastomer-based film.

7. The method according to claim 2, wherein the capacitor is a component of a strain sensor or a pressure sensor of a wearable sensory garment.

8. The method according to claim 1, wherein the elastomer-based strain-sensing electronic device is the resistor, the first film is the resistive element of the resistor, and the elastomer-based composite and the elastomer-based film encapsulate the first film.

9. The method according to claim 8, wherein the first liquid material comprises a precursor of a dielectric elastomer material and the second liquid material comprises a precursor of an electrically-conductive elastomer material.

10. The method according to claim 8, wherein the first film is an electrically-conductive liquid film.

11. The method according to claim 10, wherein the first liquid material comprises a precursor of a dielectric elastomer material and the second liquid material is a liquid electrical conductor.

12. The method according to claim 11, the method further comprising, after the printing of the liquid electrical conductor to form the electrically-conductive liquid film:
curing the additional quantity of the precursor of the dielectric elastomer material to form the elastomer-based film that encapsulates the electrically-conductive liquid film with elastomer-based composite.

13. The method according to claim 8, wherein the resistor is a component of a strain sensor or a pressure sensor of a wearable sensory garment.

14. The method according to claim 1, wherein the three-dimensional printer directly prints the first and second liquid materials by actuating a first syringe that dispenses the first liquid material through a nozzle and then actuating a second syringe that dispenses the second liquid material through the nozzle.

15. A method of fabricating an elastic strain sensor of a wearable sensory garment, the method comprising:
providing a first liquid material that comprises a precursor of an electrically-conductive elastomer material and providing a second liquid material that comprises a precursor of a dielectric elastomer material;
printing a first quantity of the first liquid material on a fabric substrate of the wearable sensory garment, the first quantity of the first liquid material being printed with a three-dimensional printer that directly prints the first quantity of the first liquid material onto the fabric substrate so that a portion of the first liquid material infiltrates a surface region of the fabric substrate as a result of the first quantity of the first liquid material wicking through fibers of the fabric substrate;
curing the precursor of the electrically-conductive elastomer material of the first quantity of the first liquid material to form a solid matrix of an electrically-conductive elastomer-based composite electrode that comprises the matrix and the fabric substrate, wherein infiltration of the fabric substrate is such that the electrically-conductive elastomer-based composite electrode cannot be removed from the fabric substrate without tearing the electrically-conductive elastomer-based composite electrode or the fabric substrate;
printing the second liquid material on the electrically-conductive elastomer-based composite electrode with the three-dimensional printer;
curing the precursor of the dielectric elastomer material to form a dielectric elastomer-based film on the electrically-conductive elastomer-based composite;
printing an additional quantity of the first liquid material on the dielectric elastomer-based film with the three-dimensional printer; and then
curing the precursor of the electrically-conductive elastomer material of the additional quantity of the first liquid material to form an electrically-conductive elastomer-based film electrode;
wherein the electrically-conductive elastomer-based composite electrode, the electrically-conductive elastomer-based film electrode, and the dielectric elastomer-based film therebetween are elastically-deformable electrical components of a capacitor of the elastic strain sensor and elastically deform when the capacitor experiences strain of at least 50%.

16. The method according to claim 15, wherein the three-dimensional printer directly prints the first and second liquid materials by actuating a first syringe that dispenses the first liquid material through a nozzle and then actuating a second syringe that dispenses the second liquid material through the nozzle.

* * * * *